(12) United States Patent
Chen et al.

(10) Patent No.: US 9,536,827 B1
(45) Date of Patent: Jan. 3, 2017

(54) SEMICONDUCTOR STRUCTURES

(71) Applicant: TAIWAN SEMICONDUCTOR MANUFACTURING COMPANY LTD., Hsinchu (TW)

(72) Inventors: Yu Hsiang Chen, Hsinchu County (TW); Shao-Yu Chou, Hsinchu County (TW); Chun-Hao Chang, Taichung (TW); Liang-Chuan Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/055,121

(22) Filed: Feb. 26, 2016

(51) Int. Cl.
| | | |
|---|---|---|
| *H01L 23/52* | (2006.01) |
| *H01L 23/522* | (2006.01) |
| *H01L 23/528* | (2006.01) |
| *H01L 29/417* | (2006.01) |
| *H01L 29/78* | (2006.01) |
| *H01L 27/088* | (2006.01) |
| *H01L 27/02* | (2006.01) |

(52) U.S. Cl.
CPC ......... *H01L 23/5226* (2013.01); *H01L 23/528* (2013.01); *H01L 27/0207* (2013.01); *H01L 27/088* (2013.01); *H01L 29/4175* (2013.01); *H01L 29/78* (2013.01)

(58) Field of Classification Search
CPC .............. H01L 23/5226; H01L 23/528; H01L 27/0207; H01L 27/088; H01L 29/4175; H01L 29/78; H01L 29/788; H01L 23/522; H01L 21/76816; H01L 23/49838; H01L 23/5386; H01L 27/11504

USPC ....... 257/211, 315, 316, 319, 486, 758, 760, 257/774; 438/98, 197, 257, 453, 523, 625, 438/629, 675

See application file for complete search history.

(56) References Cited

U.S. PATENT DOCUMENTS

| | | | | | |
|---|---|---|---|---|---|
| 6,093,603 A | * | 7/2000 | Yamaguchi | ....... | H01L 21/76202 257/314 |
| 6,462,375 B1 | * | 10/2002 | Wu | .................... | H01L 21/28273 257/316 |
| 7,525,198 B2 | * | 4/2009 | Kishishita | ......... | H01L 21/76838 257/207 |
| 2003/0141541 A1 | * | 7/2003 | Wu | .................... | H01L 21/28273 257/319 |
| 2003/0143790 A1 | * | 7/2003 | Wu | .................... | H01L 27/11521 438/197 |

(Continued)

*Primary Examiner* — Jarrett Stark
*Assistant Examiner* — Shahed Ahmed
(74) *Attorney, Agent, or Firm* — WPAT, P.C., Intellectual Property Attorneys; Anthony King

(57) ABSTRACT

The present disclosure relates to a semiconductor structure which includes a first row of diffusion strap having two sections separated by a first distance, a second row of diffusion strap having two sections separated by the first distance, a third row of diffusion strap having two sections separated by the first distance, a fourth row of diffusion strap having two sections separated by the first distance, a first row of conductive strap over the first row of diffusion strap and the second row of diffusion strap, and a second row of conductive strap over the third row of diffusion strap and the fourth row of diffusion strap. The first row of conductive strap has two sections separated by a second distance. The second row of conductive strap has having two sections separated by the second distance, wherein the second distance is greater than the first distance.

20 Claims, 12 Drawing Sheets

(56) References Cited

U.S. PATENT DOCUMENTS

| | | | |
|---|---|---|---|
| 2004/0120175 A1* | 6/2004 | Schrom | H01L 27/0705 365/51 |
| 2006/0079052 A1* | 4/2006 | Kanamori | H01L 27/115 438/257 |
| 2009/0059651 A1* | 3/2009 | Aoki | G11C 13/0007 365/148 |
| 2009/0213660 A1* | 8/2009 | Pikhay | G11C 16/0441 365/185.18 |
| 2013/0215683 A1* | 8/2013 | Lee | G11C 16/0466 365/185.29 |

* cited by examiner

SEMICONDUCTOR STRUCTURES

BACKGROUND

Modern semiconductor packages are formed from multiple stacked material layers that may include numerous active devices electrically coupled together by conductive metal interconnects and lines. Interconnect structures comprising metallization lines such as copper lines connect various components of semiconductor integrated circuits (ICs). The metallization lines within each interconnect layer are formed in an interlayer dielectric (ILD) material such as a low-k dielectric. The ILD material electrically isolates metallization lines from one another within each level and in adjacent levels of interconnect structures.

Back end-of-line ("BEOL") fabrication processes are used to create an intricate network of conductive interconnects in each layer and between the multiple layers. Damascene processes including single damascene process and dual-damascene process are routinely used for fabricating multi-level interconnect structures. In a damascene process, trenches and via holes are made inside and through an ILD layer, and filled with a conductive material, such as copper (Cu) or a Cu-based alloy, to create metallization lines and vertical conductive paths (vias) between adjacent layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3C illustrates a layout view of the vias of the semiconductor structure shown in FIG. 3B, in accordance with some embodiments of the present disclosure.

DETAILED DESCRIPTION

Figure 1:
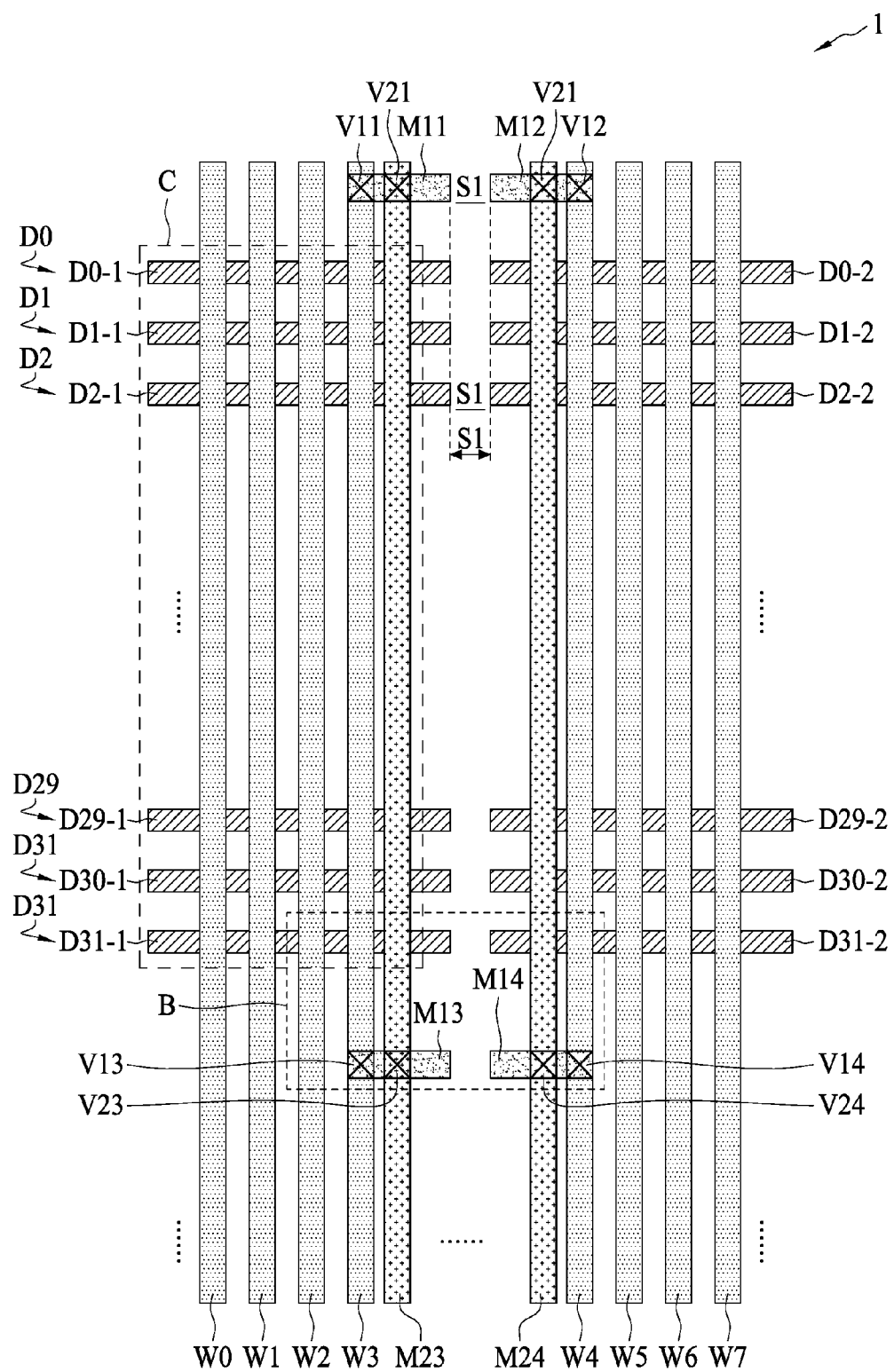
FIG. 1 illustrates a layout view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to the figures, wherein like numerals indicate like parts throughout the several views. FIG. 1 illustrates a layout view of a semiconductor structure in accordance with some embodiments of the present disclosure. Referring to FIG. 1, a semiconductor structure 1 may include a number of rows of source/drain diffusion straps D0, D1, D2, . . . , D29, D30, D31. It is contemplated that exemplary rows of source/drain diffusion straps D0 to D31 are illustrated for brevity and explanation; however, more rows of source/drain diffusion straps may be included in accordance with some embodiments of the present disclosure.

Each of the rows of source/drain diffusion straps D0 to D31 has a number of sections. For example, the row of source/drain diffusion strap D0 has sections D0-1, D0-2, and may also have D0-3 to D0-N (which are not shown in FIG. 1), N being a natural number. In the present embodiment, the contemplated exemplary sections D0-1. D0-2, D1-1, D1-2, D2-1, D2-1, . . . , D29-1, D29-2, D30-1, D30-2, D31-1 and D31-2 of each of rows of source/drain diffusion straps D0, D1, D2, . . . , D29, D30 and D31 are illustrated for brevity and explanation; however, more sections of each of rows of source/drain diffusion straps may be included in accordance with some embodiments of the present disclosure.

The rows of source/drain diffusion straps D0 to D31 may be formed, for example, by implantation technique to introduce dopant atoms and/or molecules into a semiconductor substrate (not shown in FIG. 1). Although it is not illustrated, shallow trench isolation (STI) regions may be formed in the semiconductor substrate. The STI regions, which may be formed of suitable dielectric materials, are provided to isolate transistors (e.g., source and drain regions which are not shown in FIG. 1) electrically from neighboring semiconductor components such as other transistors (not shown in FIG. 1). Each of the rows of source/drain diffusion straps D0 to D31 may include a number of source/drain diffusion regions (not denoted in FIG. 1). Moreover, the rows of source/drain diffusion straps D0 to D31 may be disposed at a same elevation, for example, a same conductive layer.

Every two sections (e.g., sections D0-1 and D10-2) of each of the rows of source/drain diffusion straps D0 to D31 may be separated from each other by a space S1. In an embodiment, space S1 has a width from approximately 0.02 micrometers ($\mu m$) to approximately 0.04 $\mu m$. In another embodiment, space S1 has a width from approximately 0.027 $\mu m$ to approximately 0.033 $\mu m$. In still another embodiment, space S1 a width of approximately 0.03 $\mu m$.

The semiconductor structure 1 may include a number of columns of gate straps W0, W1, W2, W3, W4, W5, W6, W7 over the rows of source/drain diffusion straps D0, D1, D2, ..., D29, D30, D31. It is contemplated that exemplary columns of gate straps W0 to W7 are illustrated for brevity and explanation; however, more columns of gate straps may be included in accordance with some embodiments of the present disclosure.

Each of the columns of gate straps W0 to W7 may include but is not limited to copper or another suitable metal or alloy.

The columns of gate straps W0, W1, W2 and W3 are formed on the sections D0-1 to D31-1. An array of transistors may be formed at intersections of the columns of gate straps W0 to W3 and the sections D0-1 to D31-1. The array of transistors may function to serve as a memory array.

The columns of gate straps W4, W5, W6 and W7 are formed on the sections D0-2 to D31-2. An array of transistors may be formed at intersections of the columns of gate straps W4 to W7 and the sections D0-2 to D31-2. Similarly, the array of transistors may function to serve as a memory array. Each of the columns of gate straps W0 to W7 may function as a word line.

The semiconductor structure 1 may include a row of conductive straps M11, M12 over the columns of gate straps W0 to W7. In the row of conductive straps M11, M12, section M11 and section M12 are separated from one another by the space S1. The row of conductive straps M11, M12 may include but is not limited to copper or another suitable metal or alloy. The section M11 is electrically connected to the column of gate strap W3 by a conductive via V11, while the section M12 is electrically connected to the column of gate strap W4 by a conductive via V12.

The semiconductor structure 1 may include a row of conductive straps M13, M14 over the columns of gate straps W0 to W7. In the row of conductive straps M13, M14, section M13 and section M14 are separated from one another by the space S1. The row of conductive straps M13, M14 may be similar to the row of conductive straps M11, M12. For example, the section M13 is electrically connected to the column of gate strap W3 by a conductive via V13, while the section M14 is electrically connected to the column of gate strap W4 by a conductive via V14. The row of conductive straps M11, M12 and the row of conductive straps M13, M14 may be disposed at a same elevation, for example, a same conductive layer.

The semiconductor structure 1 may include a column of conductive strap M23 over the section M11 of the row of conductive straps M11, M12 and over the section M13 of the row of conductive straps M13, M14. The section M11 is electrically connected to the column of conductive strap M23 by a conductive via V21. The section M13 is electrically connected to the column of conductive strap M23 by a conductive via V23. Moreover, the section M11 is electrically connected to the section M13 via the conductive via V21, the column of conductive strap M23 and the conductive via V23. The column of conductive strap M23 may include but is not limited to copper or another suitable metal or alloy.

The semiconductor structure 1 may include a column of conductive strap M24 over the section M12 of the row of conductive strap M11, M12 and over the section M14 of the row of conductive strap M13, M14. The section M12 is electrically connected to the column of conductive strap M24 by a conductive via V22. The section M14 is electrically connected to the column of conductive strap M24 by a conductive via V24. Moreover, the section M12 is electrically connected to the section M14 via the conductive via V22, the column of conductive strap M24 and the conductive via V24. The column of conductive strap M24 may include but is not limited to copper or another suitable metal or alloy.

Figure 1A:
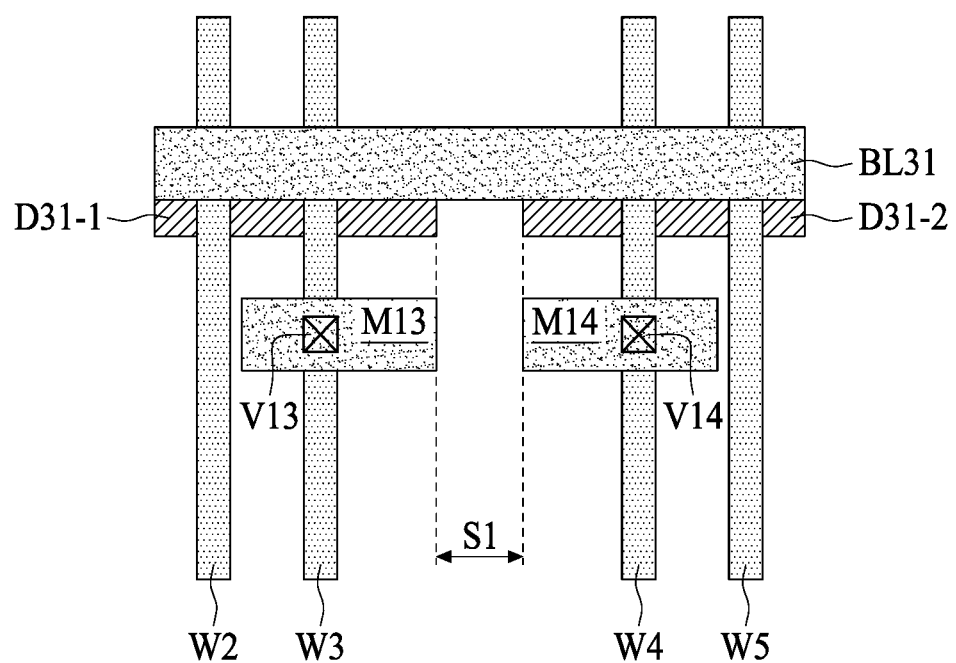
FIG. 1A illustrates an enlarged view of a portion of the semiconductor structure shown in FIG. 1, in accordance with some embodiments of the present disclosure.

FIG. 1A illustrates an enlarged view of a portion of the semiconductor structure 1 shown in FIG. 1, in accordance with some embodiments of the present disclosure, in particular, of the semiconductor structure 1 in a box "B" as shown in FIG. 1 is enlarged. Although not specifically illustrated in FIG. 1, however, it is contemplated that the semiconductor structure 1 may include a number of bit lines, where each of the bit lines electrically is connected to one of the rows of source/drain diffusion straps D0 to D31. For example, as shown in FIG. 1A, a bit line BL31 may be electrically connected to the row of source/drain diffusion strap D31. The bit line BL31 and the row of conductive straps M13, M14 may be disposed at a same elevation. The bit line BL31 may include but is not limited to copper or another suitable metal or alloy.

Figure 1B:
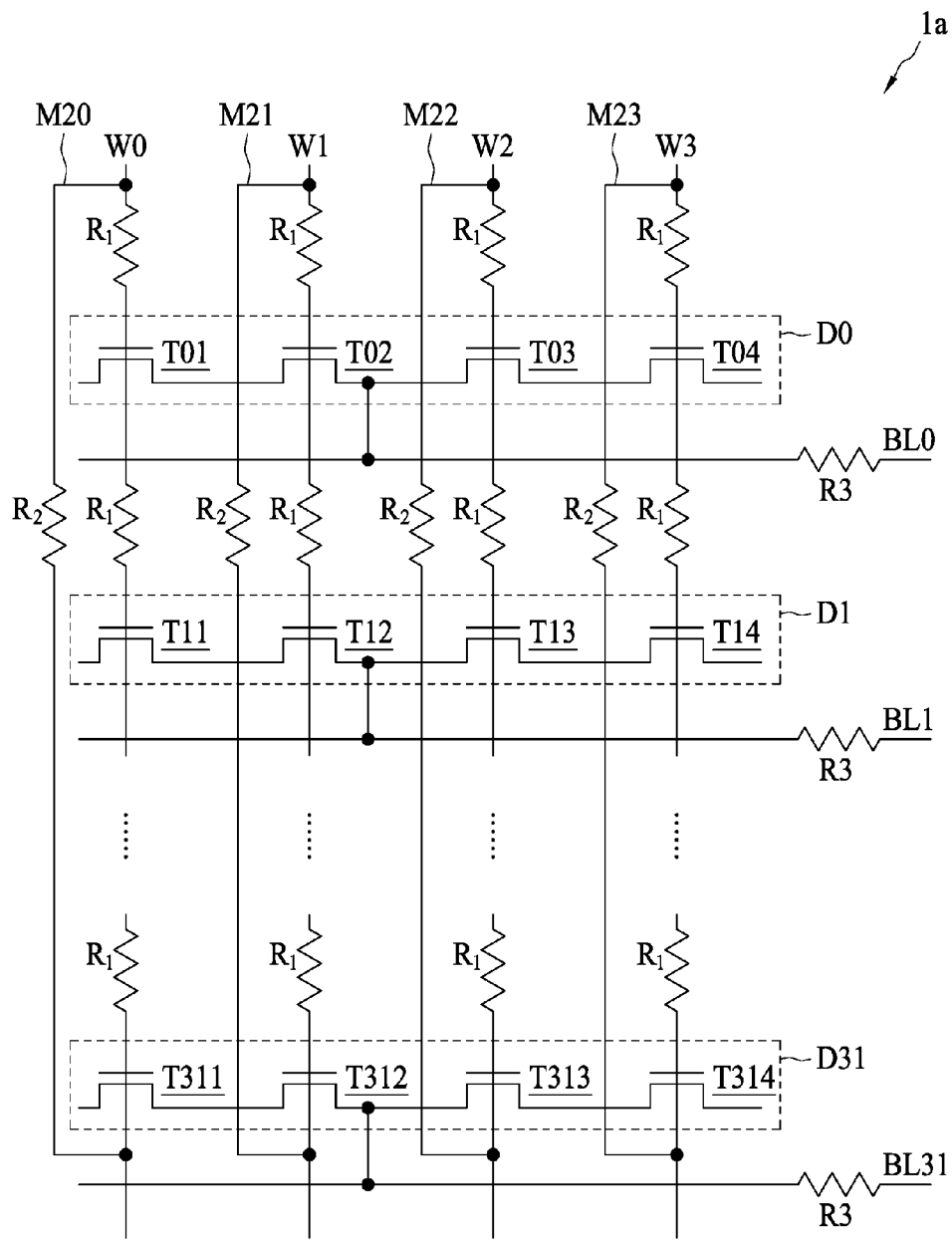
FIG. 1B illustrates a schematic circuit diagram of an equivalent circuit of a portion of the semiconductor structure shown in FIG. 1, in accordance with some embodiments of the present disclosure.

FIG. 1B illustrates a schematic circuit diagram of an equivalent circuit of a portion of the semiconductor structure shown in FIG. 1, in accordance with some embodiments of the present disclosure. Referring to FIG. 1B, circuit 1a is an equivalent circuit of the memory array enclosed by a box "A" (denoted by dotted lines) as shown in FIG. 1. The circuit 1a of the memory array may include an array of transistors T01, T02, T03, T04, T11, T12, T13, T14, ..., T311, T312, T313 and T314, which may be formed at the intersections of each of the columns of gate straps W0 to W3 and each of the sections D0-1 to D31-1 of the rows of source/drain diffusion straps D0 to D31.

The circuit 1a of the memory array may include word lines W0, W1, W3 and W4, which may correspond to the columns of gate straps W0, W1, W2 and W3 as shown in FIG. 1. Each of the word lines W0, W1, W3 and W4 is electrically connected to gates of a column of transistors. For example, the word line W0 is electrically connected to gates of a column of transistors T01, T11, ..., and T311. Each of the word lines W0, W1, W3 and W4 has a resistance R1 between two adjacent transistors. In accordance with some embodiments of the present disclosure, the resistance R1 may be approximately 2000 ohms (denoted "$\Omega$"). In accordance with some embodiments of the present disclosure, the resistance R1 may be smaller than 2000$\Omega$ if each gate of the transistors has a resistance value from 5 to 100$\Omega$. In accordance with some embodiments of the present disclosure, the resistance R1 is greater than 2000Ω if each gate of the transistors has a resistance value from 5 to 100Ω.

The circuit 1a of the memory array may include bit lines BL0, BL1, . . . , BL31. The bit lines BL0 to BL31 may include but is not limited to copper or another suitable metal or alloy. Each of the bit lines BL0 to BL31 may be electrically connected to each of the rows of source/drain diffusion straps D0 to D31. For example, the bit line BL0 is electrically connected to the row of source/drain diffusion strap D0. Each of the bit lines BL0 to BL31 has a resistance R3.

The circuit 1a of the memory array may include columns of conductive straps M20, M21, M22 and M23. The columns of conductive straps M20, M21, M22 and M23 may include but are not limited to copper or another suitable metal or alloy. Although not illustrated in FIG. 1, however, it is contemplated that the semiconductor structure 1 may include the columns of conductive straps M20, M21 and M22 where each of them has similar structure and arrangements to those of the column of conductive strap M23. Each of the columns of conductive straps M20, M21, M22 and M23 has a resistance R2. Each of the columns of conductive straps M20, M21, M22 and M23 is electrically connected to, for example but is not limited to thirty-two (32) transistors, in parallel. For example, the column of conductive strap M23 is electrically connected to transistors T04, T14, . . . and T314 in parallel. The resistance R2 of each of the columns of conductive straps M20, M21, M22 and M23 is approximately 200Ω. In accordance with some embodiments of the present disclosure, it is contemplated that each of the columns of conductive straps M20, M21, M22 and M23 may be electrically connected to a number of transistors (either greater or smaller than 32 transistors) in parallel.

During a read mode of the circuit 1a, for example, when a read event is operated on the transistor T154, a maximum resistive load on the current path along the wordline W3 would be a sixteenfold R1 (16×R1, which may be of approximately 16,000Ω. The maximum resistive load (16× R1) on the current path along the wordline W3 would be a sum of resistance R1 associated with the transistor T04, resistance R1 associated with the transistor T14, resistance R1 associated with the transistor T24, . . . , and resistance R1 associated with the transistor T154 along the wordline W3. The maximum resistive load (16×R1) on the current path along the wordline W3 would be a sum of resistance R1 associated with the transistor T314, resistance R1 associated with the transistor T304, resistance R1 associated with the transistor T294, . . . , and resistance R1 associated with the transistor T164 along the wordline W3.

Referring back to FIG. 1, during a write mode of the semiconductor structure 1, the row of conductive straps M11, M12 (also the row of conductive straps M13, M14) may be susceptible to a breakdown or burnout due to the relatively smaller (e.g. about 0.03 μm) space S1 which separates the section M11 from the section M12.

Figure 2:
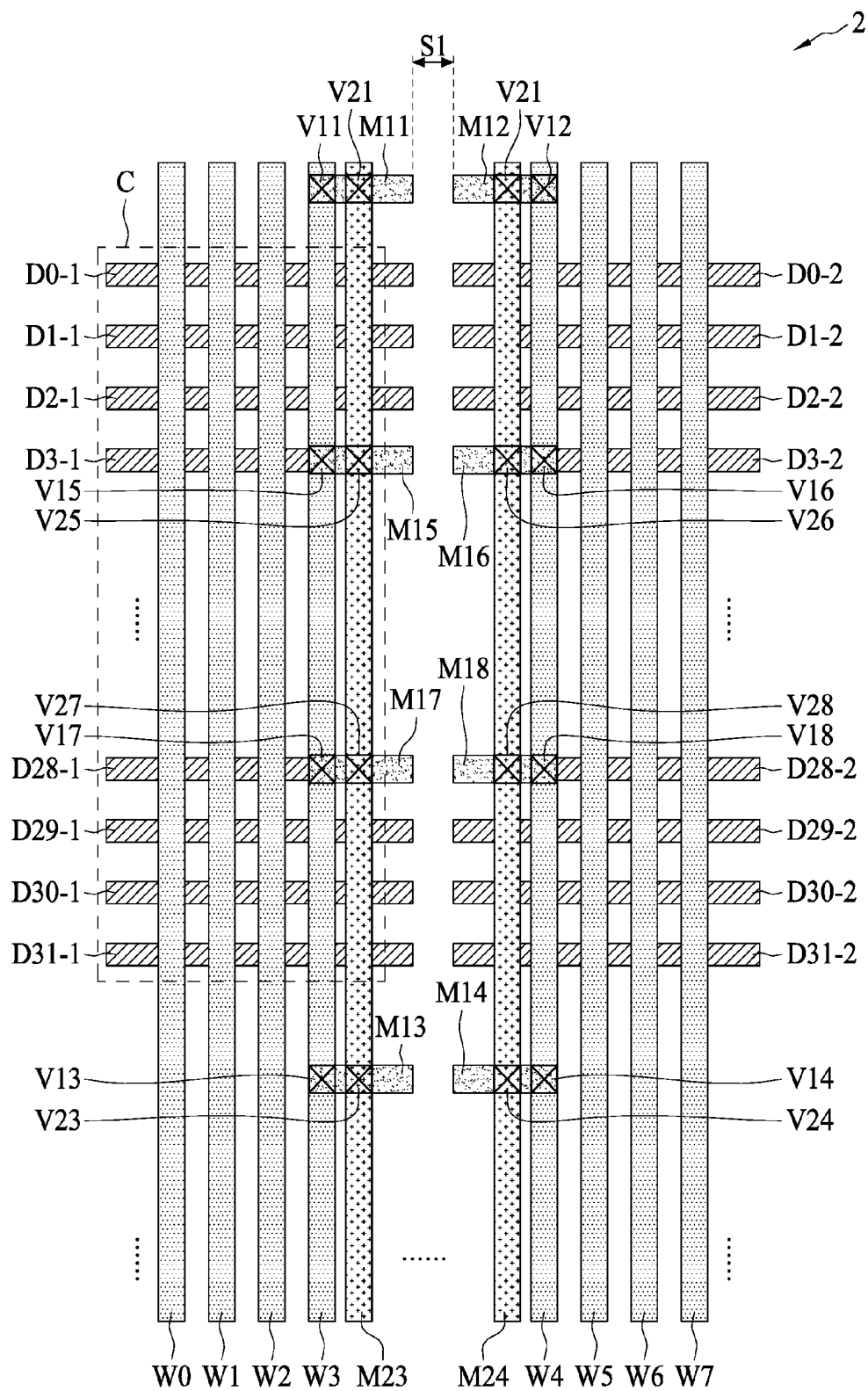
FIG. 2 illustrates a layout view of another semiconductor structure in accordance with some embodiments of the present disclosure.

FIG. 2 illustrates a layout view of another semiconductor structure in accordance with some embodiments of the present disclosure. Referring to FIG. 2, a semiconductor structure 2 may be similar to the semiconductor structure 1 as illustrated and described with reference to FIG. 1, except that the semiconductor structure 2 further includes more rows of conductive straps over the columns of gate straps W0 to W7.

For example, a row of conductive straps M15, M16 is formed over the columns of gate straps W0 to W7. The row of conductive straps M15, M16 has a section M15 and a section M16 separated from one another by the space S1. The row of conductive straps M15. M16 may be similar to the row of conductive straps M11, M12. The section M15 of the row of conductive straps M15, M16 is electrically connected to the column of gate strap W3 by a conductive via V15. The section M16 of the row of conductive straps M15, M16 is electrically connected to the column of gate strap W4 by a conductive via V16.

For example, a row of conductive straps M17, M18 is formed over the columns of gate straps W0 to W7. The row of conductive straps M17, M18 has a section M17 and a section M18 separated from one another by the space S1. The row of conductive straps M17, M18 may be similar to the row of conductive straps M11, M12. The section M17 of the row of conductive straps M17, M18 is electrically connected to the column of gate strap W3 by a conductive via V17. The section M18 of the row of conductive straps M17, M18 is electrically connected to the column of gate strap W4 by a conductive via V18. The row of conductive straps M15, M16, the row of conductive straps M17, M18 and the row of conductive straps M11, M12 may be disposed at a same elevation.

The column of conductive strap M23 is over the section M15 of the row of conductive straps M15, M16 and over the section M17 of the row of conductive straps M17, M18. The section M15 of the row of conductive straps M15, M16 is electrically connected to the column of conductive strap M23 by a conductive via V25. The section M17 of the row of conductive straps M17, M18 is electrically connected to the column of conductive strap M23 by a conductive via V27. The section M15 of the row of conductive straps M15, M16 is electrically connected to the section M17 of the row of conductive straps M17, M18 by the conductive via V25, the column of conductive strap M23 and the conductive via V27.

The column of conductive strap M24 is over the section M16 of the row of conductive straps M15, M16 and over the section M18 of the row of conductive straps M17, M18. The section M16 of the row of conductive straps M15, M16 is electrically connected to the column of conductive strap M24 by a conductive via V26. The section M18 of the row of conductive straps M17, M18 is electrically connected to the column of conductive strap M24 by a conductive via V28. The section M16 of the row of conductive straps M15, M16 is electrically connected to the section M18 of the row of conductive straps M17, M18 by the conductive via V26, the column of conductive strap M24 and the conductive via V28.

It is contemplated that more or less rows of conductive straps over the columns of gate straps W0 to W7 may be included in the semiconductor structure 2.

Figure 2A:
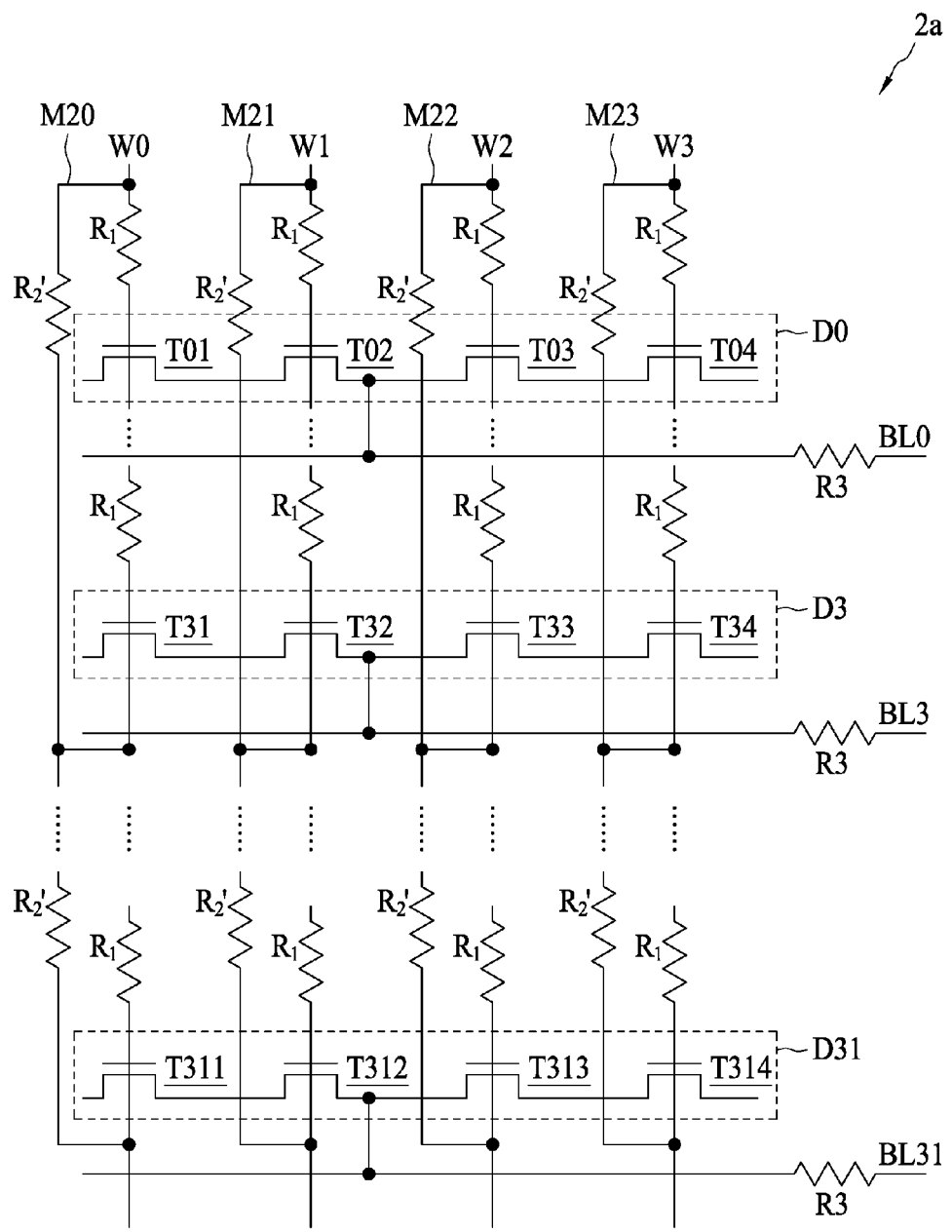
FIG. 2A illustrates a schematic circuit diagram of an equivalent circuit of a portion of the semiconductor structure shown in FIG. 2, in accordance with some embodiments of the present disclosure.

FIG. 2A illustrates a schematic circuit diagram of an equivalent circuit of a portion of the semiconductor structure shown in FIG. 2, in accordance with some embodiments of the present disclosure. Referring to FIG. 2A, circuit 2a is an equivalent circuit of the memory array enclosed by the box "C" (denoted by dotted line) as shown in FIG. 2. The circuit 2a is similar to the circuit 1a as illustrated and described with reference to FIG. 1B, except that a part of each of the columns of conductive straps M20, M21, M22 and M23 is electrically connected to, for example but is not limited to a number of four (4) transistors in parallel. For example, a part of the column of conductive strap M20 is electrically connected to transistors T01, T11, T21 and T31 in parallel. Each part of the columns of conductive straps M20, M21, M22 and M23 that is electrically connected to four transistors in parallel has a resistance R2'. The resistance R2' is approximately one fourth of the resistance R2. In accordance with some embodiments of the present disclosure, it is contemplated that each of the columns of conductive straps M20, M21, M22 and M23 may be electrically connected to a number of transistors (either greater or smaller than 4 transistors) in parallel.

During a read mode of the circuit 2a, for example, when a read event is operated on the transistor T14, a maximum resistive load on the current path along the wordline W3 would be a twofold R1 (2×R1), which may be of approximately 2,000Ω. The maximum resistive load (2×R1) on the current path along the wordline W3 would be a sum of resistance R1 associated with the transistor T04 and resistance R1 associated with the transistor T14 along the wordline W3. The maximum resistive load (2×R1) on the current path along the wordline W3 would be a sum of resistance R1 associated with the transistor T34 and resistance R1 associated with the transistor T24 along the wordline W3. In the arrangement of the column of conductive strap M23, each part thereof is electrically connected to four transistors in parallel such that the resistive load on the current path along the wordline W3 would be reduced.

Referring back to FIG. 2, during a write mode of the semiconductor structure 2, the row of conductive straps M15, M16 (also the row of conductive straps M17, M18) may be susceptible to a breakdown or burnout due to the relatively smaller (e.g. about 0.03 μm) space S1 which separates the section M15 from the section M16.

Figure 3:
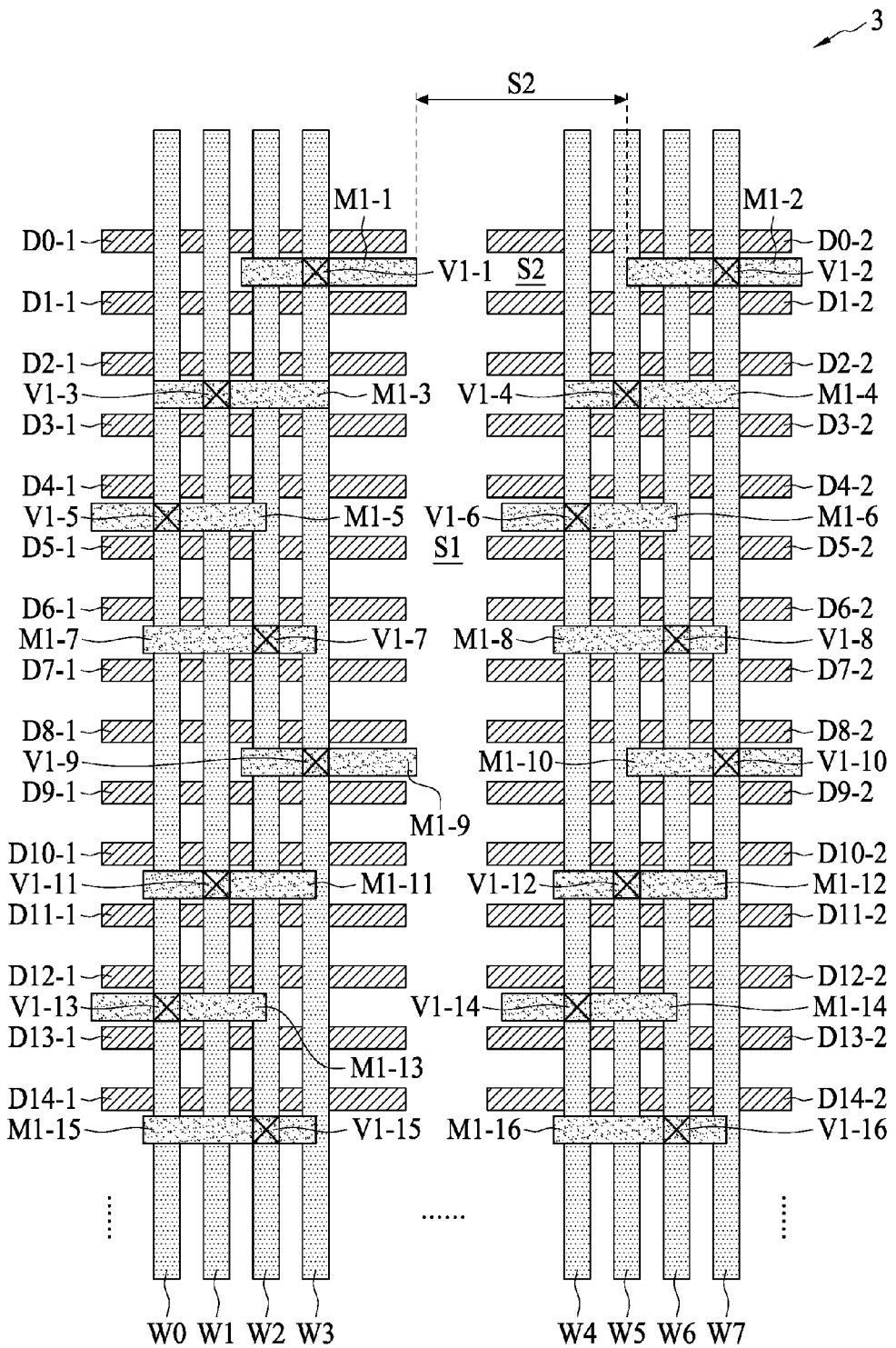
FIG. 3 illustrates a layout view of another semiconductor structure in accordance with some embodiments of the present disclosure.

FIG. 3 illustrates a layout view of another semiconductor structure in accordance with some embodiments of the present disclosure. Referring to FIG. 3, a semiconductor structure 3 may include rows of source/drain diffusion straps D0 to D31 and columns of gate straps W0 to W7 similar to those of the semiconductor structure 1 as illustrated and described with reference to FIG. 1.

The semiconductor structure 3 may include a number of rows of conductive straps M1-1, M1-2, M1-3, M1-4, M1-5, M1-6, M1-7, M1-8, M1-9, M1-10, M1-11, M1-12, M1-13, M1-14, M1-15, M1-16. It is contemplated that more or less rows of conductive straps may be included in the semiconductor 3, though it is not illustrated.

Each of the rows of conductive straps M1-1 to M1-16 is formed over the rows of source/drain diffusion straps D0 to D31 and the columns of gate straps W0 to W7. Each of the rows of conductive straps M1-1 to M1-16 may include similar material to the row of conductive straps M11, M12 as shown in FIG. 1.

The row of conductive straps M1-1, M1-2 is formed between the row of source/drain diffusion straps D0-1, D0-2 and the row of source/drain diffusion strap D1-1, D1-2. The row of conductive straps M1-3, M1-4 is formed between the row of source/drain diffusion straps D2-1, D2-2 and the row of source/drain diffusion straps D3-1, D3-2. The row of conductive straps M1-5, M1-6 is formed between the row of source/drain diffusion straps D4-1, D4-2 and the row of source/drain diffusion straps D5-1, D5-2. The row of conductive straps M1-7, M1-8 is formed between the row of source/drain diffusion straps D6-1, D6-2 and the row of source/drain diffusion straps D7-1, D7-2. The row of conductive straps M1-9, M1-10 is formed between the row of source/drain diffusion straps D8-1, D8-2 and the row of source/drain diffusion straps D9-1, D9-2. The row of conductive straps M1-11, M1-12 is formed between the row of source/drain diffusion straps D10-1, D10-2 and the row of source/drain diffusion straps D11-1, D11-2. The row of conductive straps M1-13, M1-14 is formed between the row of source/drain diffusion straps D12-1, D12-2 and the row of source/drain diffusion straps D13-1, D13-2. The row of conductive straps M1-15, M1-16 is formed between the row of source/drain diffusion straps D14-1, D14-2 and the row of source/drain diffusion straps D15-1, D15-2.

The row of conductive straps M1-1, M1-2 has a section M1-1 and a section M1-2 separated from one another by a space S2. The row of conductive straps M1-3. M1-4 has a section M1-3 and a section M1-4 separated from one another by the space S2. The row of conductive straps M1-5, M1-6 has a section M1-5 and a section M1-6 separated from one another by the space S2. The row of conductive straps M1-7, M1-8 has a section M1-7 and a section M1-8 separated from one another by the space S2. The row of conductive straps M1-9, M1-10 has a section M1-9 and a section M1-10 separated from one another by the space S2. The row of conductive straps M1-11, M1-12 has a section M1-11 and a section M1-12 separated from one another by the space S2. The row of conductive straps M1-13, M1-14 has a section M1-13 and a section M1-14 separated from one another by the space S2. The row of conductive straps M1-15, M1-16 has a section M1-15 and a section M1-16 separated from one another by the space S2.

The section M1-1 of the row of conductive straps M1-1, M1-2 is electrically connected to the column of gate strap W3 by a conductive via V1-1. The section M1-2 of the row of conductive straps M1-1, M1-2 is electrically connected to the column of gate strap W7 by a conductive via V1-7. The section M1-3 of the row of conductive straps M1-3, M1-4 is electrically connected to the column of gate strap W1 by a conductive via V1-3. The section M1-4 of the row of conductive straps M1-3, M1-4 is electrically connected to the column of gate strap W5 by a conductive via V1-4. The section M1-5 of the row of conductive straps M1-5, M1-6 is electrically connected to the column of gate strap W0 by a conductive via V1-5. The section M1-6 of the row of conductive straps M1-5, M1-6 is electrically connected to the column of gate strap W4 by a conductive via V1-6. The section M1-7 of the row of conductive straps M1-7, M1-8 is electrically connected to the column of gate strap W2 by a conductive via V1-7. The section M1-8 of the row of conductive straps M1-7, M1-8 is electrically connected to the column of gate strap W6 by a conductive via V1-8. The section M1-9 of the row of conductive straps M1-9, M1-10 is electrically connected to the column of gate strap W3 by a conductive via V1-9. The section M1-10 of the row of conductive straps M1-9, M1-10 is electrically connected to the column of gate strap W7 by a conductive via V1-10. The section M1-11 of the row of conductive straps M1-11, M1-12 is electrically connected to the column of gate strap W1 by a conductive via V1-11. The section M1-12 of the row of conductive straps M1-11. M1-12 is electrically connected to the column of gate strap W5 by a conductive via V1-12. The section M1-13 of the row of conductive straps M1-13, M1-14 is electrically connected to the column of gate strap W0 by a conductive via V1-13. The section M1-14 of the row of conductive straps M1-13, M1-14 is electrically connected to the column of gate strap W4 by a conductive via V1-14. The section M1-15 of the row of conductive straps M1-15, M1-16 is electrically connected to the column of gate strap W2 by a conductive via V1-15. The section M1-16 of the row of conductive straps M1-15, M1-16 is electrically connected to the column of gate strap W6 by a conductive via V1-16.

Each space S2 that separates every two sections of each of the rows of conductive straps M1-1 to M1-16 has a width from approximately 0.04 micrometers (μm) to approximately 0.2 μm. Each space S2 that separates every two sections of each of the rows of conductive straps M1-1 to M1-16 has a width from approximately 0.06 μm to approximately 0.12 μm. Each space S2 that separates every two sections of each of the rows of conductive straps M1-1 to M1-16 has a width from approximately 0.108 μm. The space S2 that separates every two sections of each of the rows of conductive straps M1-1 to M1-16 may be a gap or an opening.

The space S2 that separates the row of conductive straps M1-1, M1-2 and the space S2 that separates the row of conductive straps M1-3. M1-4 are misaligned. The space S2 that separates the row of conductive straps M1-1, M1-2 and the space S2 that separates the row of conductive straps M1-5, M1-6 are misaligned. The space S2 that separates the row of conductive straps M1-1, M1-2 and the space S2 that separates the row of conductive straps M1-7, M1-8 are misaligned. The space S2 that separates the row of conductive straps M1-1, M1-2 and the space S2 that separates the row of conductive straps M1-9, M1-10 are aligned.

The space S2 that separates the row of conductive straps M1-3, M1-4 and the space S2 that separates the row of conductive straps M1-5, M1-6 are misaligned. The space S2 that separates the row of conductive straps M1-3, M1-4 and the space S2 that separates the row of conductive straps M1-7, M1-8 are misaligned. The space S2 that separates the row of conductive straps M1-3, M1-4 and the space S2 that separates the row of conductive straps M1-9, M1-10 are misaligned. The space S2 that separates the row of conductive straps M1-3, M1-4 and the space S2 that separates the row of conductive straps M1-11, M1-12 are aligned.

The space S2 that separates the row of conductive straps M1-5, M1-6 and the space S2 that separates the row of conductive straps M1-7, M1-8 are misaligned. The space S2 that separates the row of conductive straps M1-5, M1-6 and the space S2 that separates the row of conductive straps M1-9, M1-10 are misaligned. The space S2 that separates the row of conductive straps M1-5, M1-6 and the space S2 that separates the row of conductive straps M1-11, M1-12 are misaligned. The space S2 that separates the row of conductive straps M1-5, M1-6 and the space S2 that separates the row of conductive straps M1-13, M1-14 are aligned.

Via V1-1 may be formed at the intersection of the section M1-1 of the row of conductive straps M1-1, M1-2 and the column of gate strap W3. Via V1-2 may be formed at the intersection of the section M1-2 of the row of conductive straps M1-1, M1-2 and the column of gate strap W7. Via V1-3 may be formed at the intersection of the section M1-3 of the row of conductive straps M1-3, M1-4 and the column of gate strap W1. Via V1-4 may be formed at the intersection of the section M1-4 of the row of conductive straps M1-3, M1-4 and the column of gate strap W5. Via V1-5 may be formed at the intersection of the section M1-5 of the row of conductive straps M1-5, M1-6 and the column of gate strap W0. Via V1-6 may be formed at the intersection of the section M1-6 of the row of conductive straps M1-5, M1-6 and the column of gate strap W4. Via V1-7 may be formed at the intersection of the section M1-7 of the row of conductive straps M1-7, M1-8 and the column of gate strap W2. Via V1-8 may be formed at the intersection of the section M1-8 of the row of conductive straps M1-7, M1-8 and the column of gate strap W6. Via V1-9 may be formed at the intersection of the section M1-9 of the row of conductive straps M1-9, M1-10 and the column of gate strap W3. Via V1-10 may be formed at the intersection of the section M1-10 of the row of conductive straps M1-9, M1-10 and the column of gate strap W7. Via V1-11 may be formed at the intersection of the section M1-11 of the row of conductive straps M1-11, M1-12 and the column of gate strap W1. Via V1-12 may be formed at the intersection of the section M1-12 of the row of conductive straps M1-11, M1-12 and the column of gate strap W5. Via V1-13 may be formed at the intersection of the section M1-13 of the row of conductive straps M1-13, M1-14 and the column of gate strap W0. Via V1-14 may be formed at the intersection of the section M1-14 of the row of conductive straps M1-13, M1-14 and the column of gate strap W4. Via V1-15 may be formed at the intersection of the section M1-15 of the row of conductive straps M1-15, M1-16 and the column of gate strap W2. Via V1-16 may be formed at the intersection of the section M1-16 of the row of conductive straps M1-15, M1-16 and the column of gate strap W6.

Figure 3A:
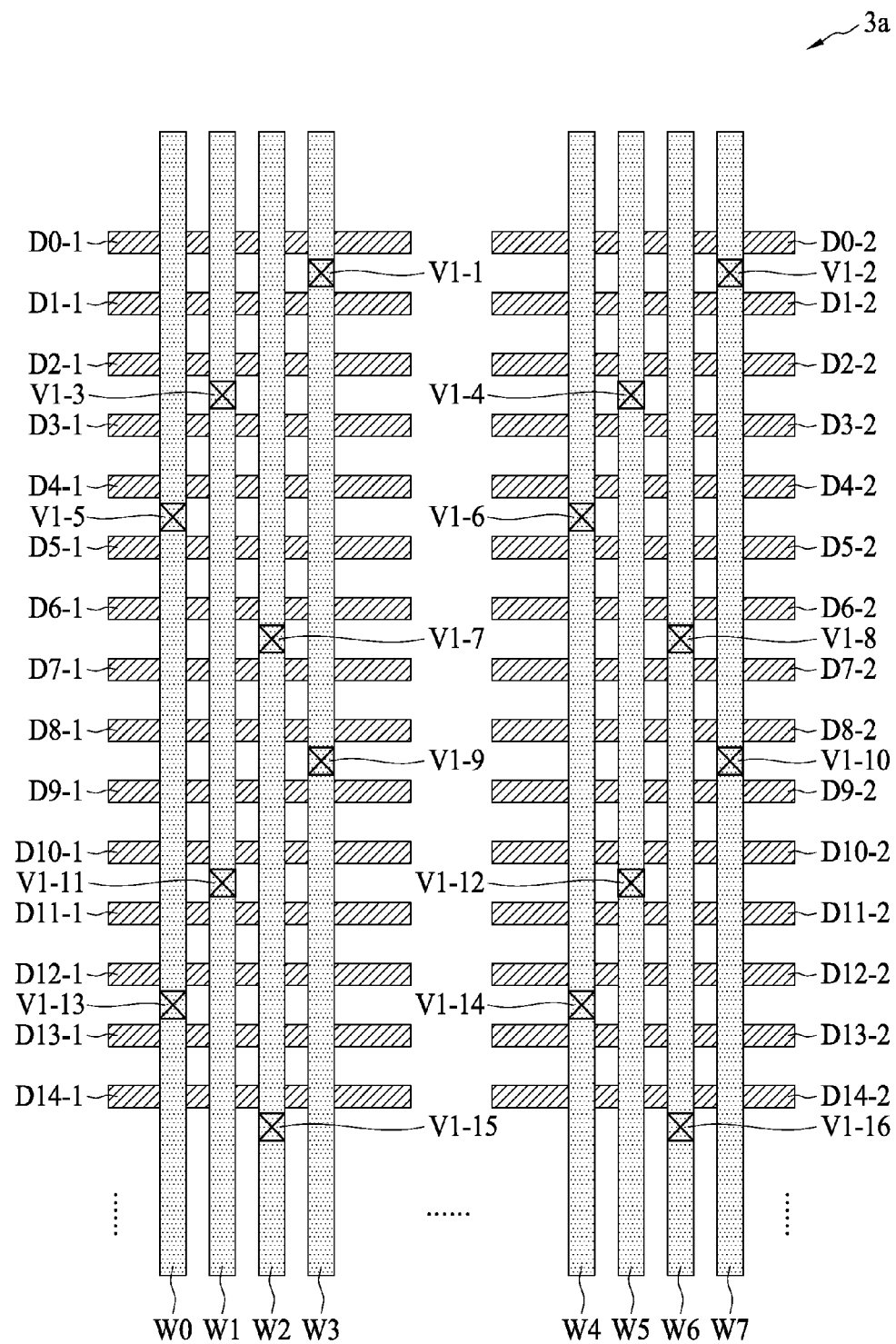
FIG. 3A illustrates a layout view of another semiconductor structure in accordance with some embodiments of the present disclosure.

FIG. 3A illustrates a layout view of another semiconductor structure in accordance with some embodiments of the present disclosure. Referring to FIG. 3A, a semiconductor structure 3a may be similar to the semiconductor structure 3 as illustrated and described with reference to FIG. 3, except that the rows of conductive straps M1-1 to M1-16 are hidden to have a relatively clear view on relation between the vias 1-1 to 1-16, the rows of source/drain diffusion straps D0 to D31 and columns of gate straps W0 to W7.

Figure 3B:
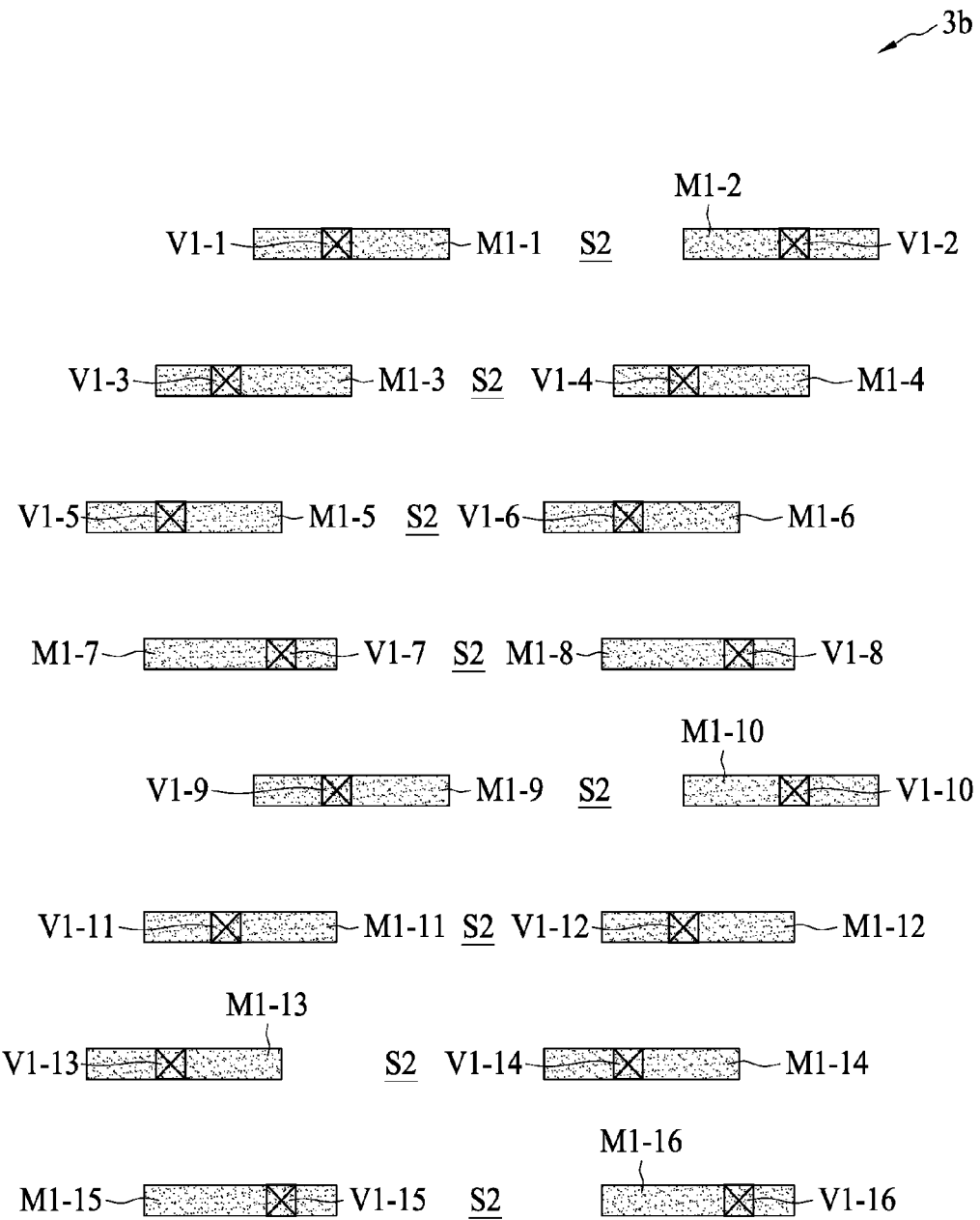
FIG. 3B illustrates a layout view of the conductive lines and vias of the semiconductor structure shown in FIG. 3, in accordance with some embodiments of the present disclosure.

FIG. 3B illustrates a layout view of the conductive lines and vias of the semiconductor structure shown in FIG. 3, in accordance with some embodiments of the present disclosure. Referring to FIG. 3B, a semiconductor structure 3b may be similar to the semiconductor structure 3 as illustrated and described with reference to FIG. 3, except that the rows of source/drain diffusion straps D0 to D31 and the columns of gate straps W0 to W7 are hidden to have a relatively clear view on the vias 1-1 to 1-16 and the rows of conductive straps M1-1 to M1-16. The spaces S2 that separate every two sections of each of the rows of conductive straps M1-1 to M1-16 may form a zigzag pattern or an "S" pattern.

FIG. 3C illustrates a layout view of the vias of the semiconductor structure shown in FIG. 3B, in accordance with some embodiments of the present disclosure. Referring to FIG. 3C, a semiconductor structure 3c may be similar to the semiconductor structure 3b as illustrated and described with reference to FIG. 3B, except that the rows of conductive straps M1-1 to M1-16 are hidden to have a relatively clear view on the vias 1-1 to 1-16. The vias V1-1, V1-3, V1-5, V1-7, V1-9, V1-111, V1-13 and V1-15 may form a zigzag pattern. The vias V1-1, V1-3, V1-5, V1-7, V1-9, V1-11, and V1-13 may form an "S" pattern. The vias V1-2, V1-4, V1-6, V1-8, V1-10, V1-12, V1-14 and V1-16 may form a zigzag pattern. The vias V1-2, V1-4, V1-6, V1-8, V1-10, V1-12 and V1-14 may form an "S" pattern.

Figure 3D:
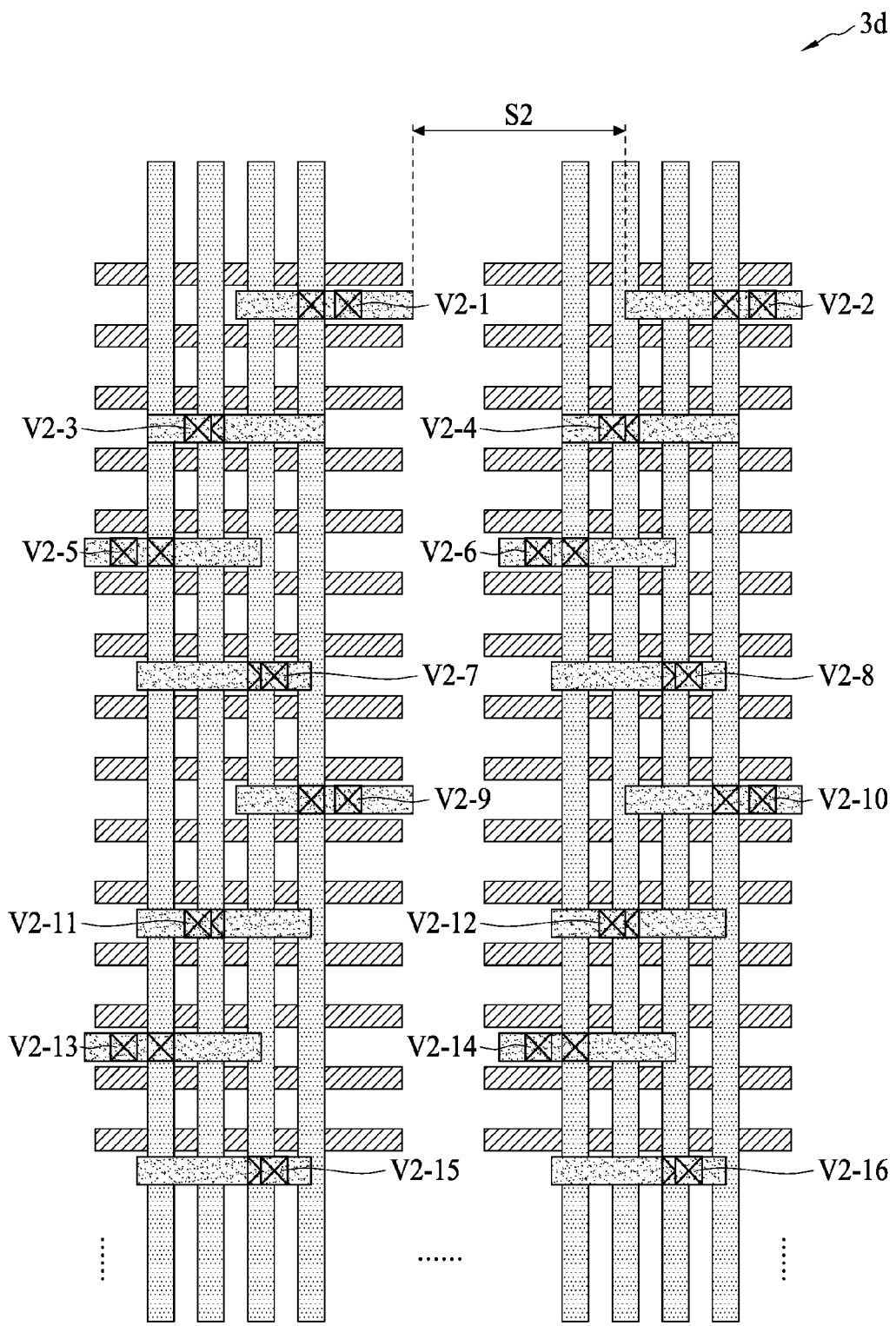
FIG. 3D illustrates a layout view of another semiconductor structure in accordance with some embodiments of the present disclosure.

FIG. 3D illustrates a layout view of another semiconductor structure in accordance with some embodiments of the present disclosure. Referring to FIG. 3D, a semiconductor structure 3d may be similar to the semiconductor structure 3 as illustrated and described with reference to FIG. 3, except that the semiconductor structure 3d further includes vias V2-1, V2-2, V2-3, V2-4, V2-5, V2-6, V2-7, V2-8, V2-9, V2-10, V2-11, V2-12, V2-13, V2-14, V2-15 and V2-16.

Via V2-1 may be formed on the section M1-1 of the row of conductive straps M1-1, M1-2, Via V2-2 may be formed on the section M1-2 of the row of conductive straps M1-1, M1-2. Via V2-3 may be formed on the section M1-3 of the row of conductive straps M1-3, M1-4. Via V2-4 may be formed on the section M1-4 of the row of conductive straps M1-3, M1-4. Via V2-5 may be formed on the section M1-5 of the row of conductive straps M1-5, M1-6. Via V2-6 may be formed on the section M1-6 of the row of conductive straps M1-5, M1-6. Via V2-7 may be formed on the section M1-7 of the row of conductive straps M1-7, M1-8. Via V2-8 may be formed on the section M1-8 of the row of conductive straps M1-7, M1-8. Via V1-9 may be formed on the section M1-9 of the row of conductive straps M1-9, M1-10. Via V1-10 may be formed on the section M1-10 of the row of conductive straps M1-9, M1-10. Via V1-11 may be formed on the section M1-11 of the row of conductive straps M1-11, M1-12. Via V1-12 may be formed on the section M1-12 of the row of conductive straps M1-11, M1-12. Via V1-13 may be formed on the section M1-13 of the row of conductive straps M1-13, M1-14. Via V1-14 may be formed on the section M1-14 of the row of conductive straps M1-13, M1-14. Via V1-15 may be formed on the section M1-15 of the row of conductive straps M1-15, M1-16. Via V1-16 may be formed on the section M1-16 of the row of conductive straps M1-15, M1-16.

Figure 3E:
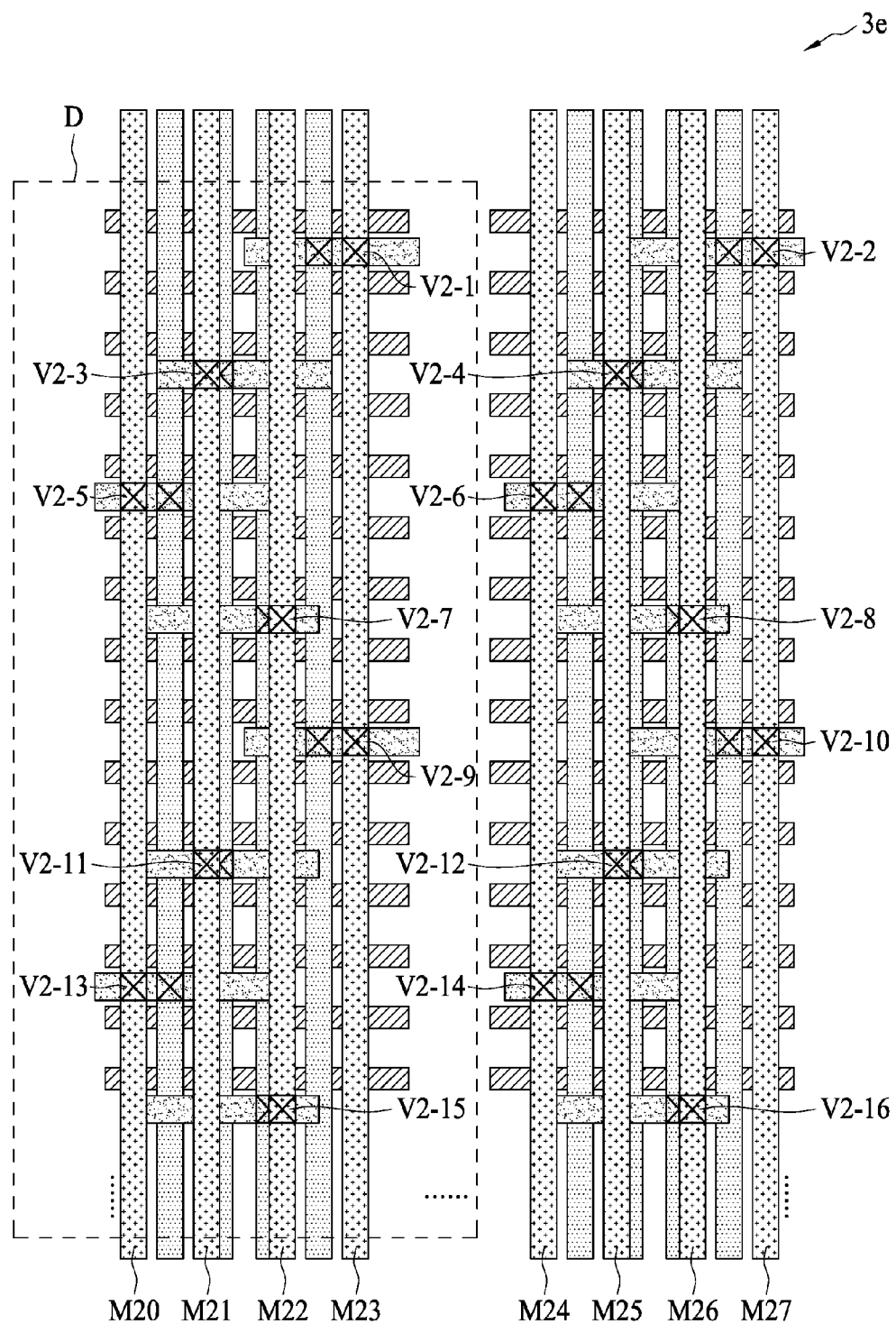
FIG. 3E illustrates a layout view of another semiconductor structure in accordance with some embodiments of the present disclosure.

FIG. 3E illustrates a layout view of another semiconductor structure in accordance with some embodiments of the present disclosure. Referring to FIG. 3E, a semiconductor structure 3e may be similar to the semiconductor structure 3d as illustrated and described with reference to FIG. 3D, except that the semiconductor structure 3e further includes columns of conductive straps M20, M21, M22, M23, M24, M25, M26 and M27.

The columns of conductive straps M20 to M27 are disposed over the rows of conductive straps M1-1 to M1-16 and the vias V2-1 to V2-16.

The column of conductive strap M20 may be electrically connected to the column of gate strap W0 through the via V2-5, the section M1-5 of the row of conductive straps M1-5, M1-6 and the via V1-5. The column of conductive strap M20 may be electrically connected to the column of gate strap W0 through the via V2-13, the section M1-13 of the row of conductive straps M1-13, M1-14 and the via V1-13. The column of conductive strap M21 may be electrically connected to the column of gate strap W1 through the via V2-3, the section M1-3 of the row of conductive straps M1-3, M1-4 and the via V1-3. The column of conductive strap M21 may be electrically connected to the column of gate strap W1 through the via V2-11, the section M1-11 of the row of conductive straps M1-11, M1-12 and the via V1-11. The column of conductive strap M22 may be electrically connected to the column of gate strap W2 through the via V2-7, the section M1-7 of the row of conductive straps M1-7, M1-8 and the via V1-7. The column of conductive strap M22 may be electrically connected to the column of gate strap W2 through the via V2-15, the section M1-15 of the row of conductive straps M1-15, M1-16 and the via V1-15. The column of conductive strap M23 may be electrically connected to the column of gate strap W3 through the via V2-1, the section M1-1 of the row of conductive straps M1-1, M1-2 and the via V1-1. The column of conductive strap M23 may be electrically connected to the column of gate strap W3 through the via V2-9, the section M1-9 of the row of conductive straps M1-9, M1-10 and the via V1-9.

The column of conductive strap M24 may be electrically connected to the column of gate strap W4 through the via V2-6, the section M1-6 of the row of conductive straps M1-5, M1-6 and the via V1-6. The column of conductive strap M24 may be electrically connected to the column of gate strap W4 through the via V2-14, the section M1-14 of the row of conductive straps M1-13, M1-14 and the via V1-14. The column of conductive strap M25 may be electrically connected to the column of gate strap W5 through the via V2-4, the section M1-4 of the row of conductive straps M1-3, M1-4 and the via V1-4. The column of conductive strap M25 may be electrically connected to the column of gate strap W5 through the via V2-12, the section M1-12 of the row of conductive straps M1-11, M1-12 and the via V1-12. The column of conductive strap M26 may be electrically connected to the column of gate strap W6 through the via V2-8, the section M1-8 of the row of conductive straps M1-7, M1-8 and the via V1-8. The column of conductive strap M26 may be electrically connected to the column of gate strap W6 through the via V2-16, the section M1-16 of the row of conductive straps M1-15, M1-16 and the via V1-16. The column of conductive strap M27 may be electrically connected to the column of gate strap W7 through the via V2-2, the section M1-2 of the row of conductive straps M1-1, M1-2 and the via V1-2. The column of conductive strap M27 may be electrically connected to the column of gate strap W7 through the via V2-10, the section M1-10 of the row of conductive straps M1-9, M1-10 and the via V1-10.

Figure 3F:
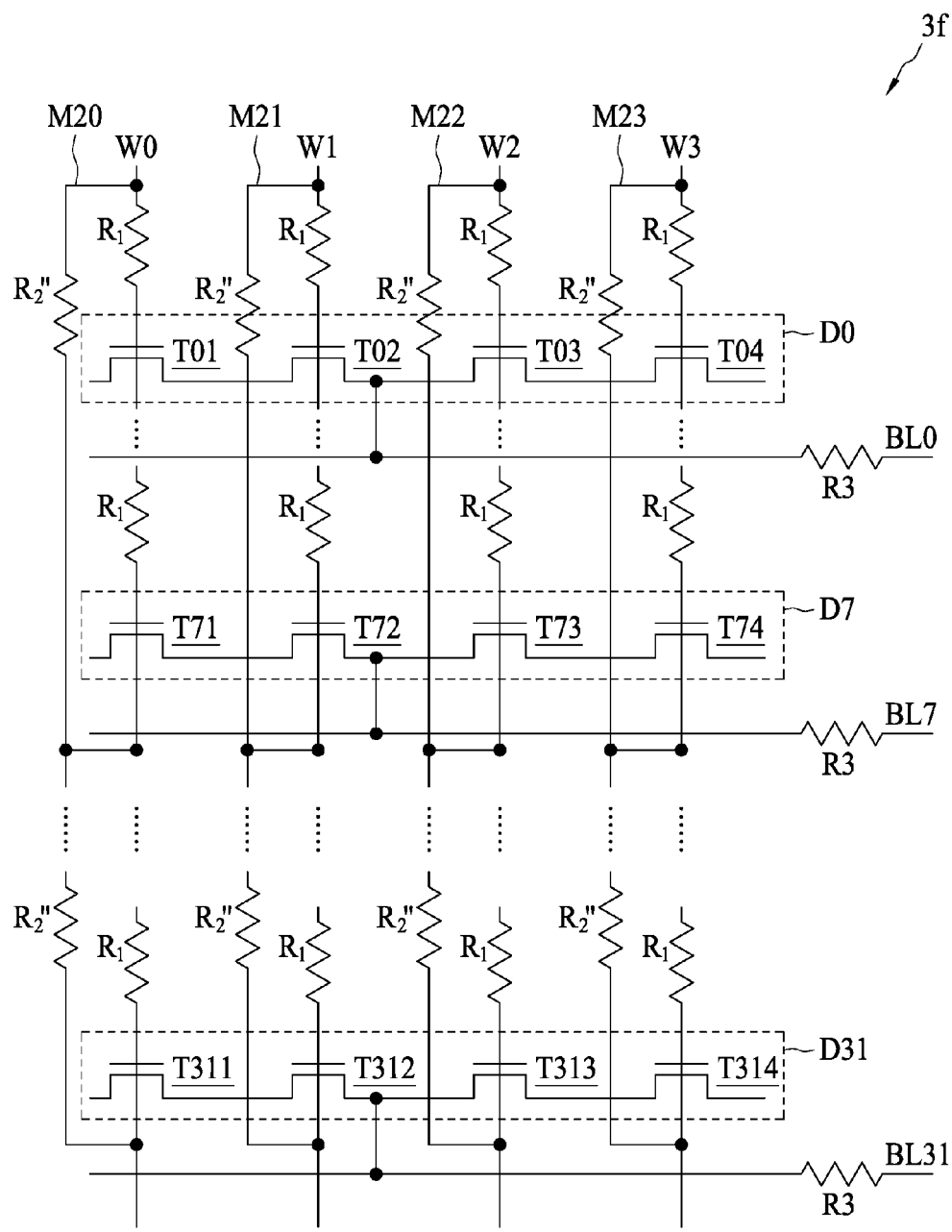
FIG. 3F illustrates a schematic circuit diagram of an equivalent circuit of a portion of the semiconductor structure shown in FIG. 3E, in accordance with some embodiments of the present disclosure.

FIG. 3F illustrates a schematic circuit diagram of an equivalent circuit of a portion of the semiconductor structure shown in FIG. 3E, in accordance with some embodiments of the present disclosure. Referring to FIG. 3F, circuit 3f is an equivalent circuit of the memory array enclosed by the box "D" (denoted by dotted line) as shown in FIG. 3E. The circuit 3f is similar to the circuit 1a as illustrated and described with reference to FIG. 1B, except that a part of each of the columns of conductive straps M20, M21, M22 and M23 is electrically connected to, for example but is not limited to a number of eight (8) transistors in parallel. For example, a part of the column of conductive strap M20 is electrically connected to transistors T01, T11, T21, T31, T41, T51, T61 and T71 in parallel. Each part of the columns of conductive straps M20, M21, M22 and M23 that is electrically connected to four transistors in parallel has a resistance R2". The resistance R2" is approximately one eighth of the resistance R2. In accordance with some embodiments of the present disclosure, it is contemplated that each of the columns of conductive straps M20, M21, M22 and M23 may be electrically connected to a number of transistors (either greater or smaller than 8 transistors) in parallel.

During a read mode of the circuit 3f, for example, when a read event is operated on the transistor T34, a maximum resistive load on the current path along the wordline W3 would be a fourthfold R1 (4×R1, which may be of approximately 8000Ω. The maximum resistive load (4×R1) on the current path along the wordline W3 would be a sum of resistance R1 associated with the transistor T04, resistance R1 associated with the transistor T14, resistance R1 associated with the transistor T24 and resistance R1 associated with the transistor T34 along the wordline W3. The maximum resistive load (4×R1) on the current path along the wordline W3 would be a sum of resistance R1 associated with the transistor T74, resistance R1 associated with the transistor T64, resistance R1 associated with the transistor T54 and resistance R1 associated with the transistor T44 along the wordline W3. In the arrangement of the column of conductive strap M23, each part thereof is electrically connected to eight transistors in parallel such that the resistive load on the current path along the wordline W3 would be reduced.

Referring back to FIG. 3E, during a write mode of the semiconductor structure 3e, which may be operated with a writing current from 100 uA to 500 uA, each space S2 that separates every two sections of each of the rows of conductive straps M1-1 to M1-16 is relatively greater to avoid breakdown or burnout on the rows of conductive straps.

In accordance with some embodiments of the present disclosure, a semiconductor structure includes a first row of source/drain diffusion strap, a second row of source/drain diffusion strap, a third row of source/drain diffusion strap, a fourth row of source/drain diffusion strap, a first row of conductive strap and a second row of conductive strap. The first row of source/drain diffusion strap has a first section and a second section separated from the first section by a first distance. The second row of source/drain diffusion strap has a first section and a second section separated from the first section by the first distance. The third row of source/drain diffusion strap has a first section and a second section separated from the first section by the first distance. The fourth row of source/drain diffusion strap has a first section and a second section separated from the first section by the first distance. The first row of conductive strap is over the first row of source/drain diffusion strap and the second row of source/drain diffusion strap. The first row of conductive strap has a first section and a second section separated from the first section by a second distance. The second row of conductive strap is over the third row of source/drain diffusion strap and the fourth row of source/drain diffusion strap. The second row of conductive strap has a first section and a second section separated from the first section by the second distance, wherein the second distance is greater than the first distance.

In accordance with some embodiments of the present disclosure, a semiconductor structure includes a first row of source/drain diffusion strap, a second row of source/drain diffusion strap, a third row of source/drain diffusion strap, a fourth row of source/drain diffusion strap, a first row of conductive strap and a second row of conductive strap. The first row of source/drain diffusion strap has a first section and a second section separated from the first section. The second row of source/drain diffusion strap has a first section and a second section separated from the first section. The third row of source/drain diffusion strap has a first section and a second section separated from the first section. The fourth row of source/drain diffusion strap has a first section and a second section separated from the first section. The first row of conductive strap is over the first row of source/drain diffusion strap and the second row of source/drain diffusion strap. The first row of conductive strap has a first section and a second section separated from the first section by a first space. The second row of conductive strap is over the third row of source/drain diffusion strap and the fourth row of source/drain diffusion strap. The second row of conductive strap has a first section and a second section separated from the first section by a second space, wherein the first space and the second space are misaligned.

In accordance with some embodiments of the present disclosure, a semiconductor structure includes a first row of source/drain diffusion strap, a second row of source/drain diffusion strap, a third row of source/drain diffusion strap, a fourth row of source/drain diffusion strap, a fifth row of source/drain diffusion strap, a sixth row of source/drain diffusion strap, a seventh row of source/drain diffusion strap, an eighth row of source/drain diffusion strap, a first column of gate strap, a second column of gate strap, a third column of gate strap, a fourth column of gate strap, a first conductive via, a second conductive via, a third conductive via and a fourth conductive via. The second row of source/drain diffusion strap is adjacent to the first row of source/drain diffusion strap. The third row of source/drain diffusion strap is adjacent to the second row of source/drain diffusion strap. The fourth row of source/drain diffusion strap is adjacent to the third row of source/drain diffusion strap. The fifth row of source/drain diffusion strap is adjacent to the fourth row of source/drain diffusion strap. The sixth row of source/drain diffusion strap is adjacent to the fifth row of source/drain diffusion strap. The seventh row of source/drain diffusion strap is adjacent to the six row of source/drain diffusion strap. The eighth row of source/drain diffusion strap is adjacent to the seventh row of source/drain diffusion strap. The first column of gate strap is over the first to the eighth row of source/drain diffusion strap. The second column of gate strap is adjacent to the first column of gate strap and over the first row to the eighth of source/drain diffusion strap. The third column of gate strap is adjacent to the second column of gate strap and over the first row to the eighth of source/drain diffusion strap. The fourth column of gate strap is adjacent to the third column of gate strap and over the first row to the eighth of source/drain diffusion strap. The first conductive via is on the first column of gate strap between the first row of source/drain diffusion strap and the second row of source/drain diffusion strap. The second conductive via is on the third column of gate strap between the third row of source/drain diffusion strap and the fourth row of source/drain diffusion strap. The third conductive via is on the fourth column of gate strap between the fifth row of source/drain diffusion strap and the sixth row of source/drain diffusion strap. The fourth conductive via is on the second column of gate strap between the seventh row of source/drain diffusion strap and the eighth row of source/drain diffusion strap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first row of source/drain diffusion strap having a first section and a second section separated from the first section by a first distance;
   a second row of source/drain diffusion strap having a first section and a second section separated from the first section by the first distance;
   a third row of source/drain diffusion strap having a first section and a second section separated from the first section by the first distance;
   a fourth row of source/drain diffusion strap having a first section and a second section separated from the first section by the first distance;
   a first row of conductive strap over the first row of source/drain diffusion strap and the second row of source/drain diffusion strap, the first row of conductive strap having a first section and a second section separated from the first section by a second distance; and
   a second row of conductive strap over the third row of source/drain diffusion strap and the fourth row of source/drain diffusion strap, the second row of conductive strap having a first section and a second section separated from the first section by the second distance, wherein the second distance is greater than the first distance.

2. The semiconductor structure of claim 1, further comprising a first column of gate strap between the first section of the first row of source/drain diffusion strap and the first section of the first row of conductive strap.

3. The semiconductor structure of claim 2, further comprising a first conductive via electrically connecting the first column of gate strap to the first section of the first row of conductive strap.

4. The semiconductor structure of claim 2, further comprising a first column of conductive strap over the first section of the first row of conductive strap.

5. The semiconductor structure of claim 4, further comprising a first conductive via electrically connecting the first column of conductive strap to the first section of the first row of conductive strap.

6. The semiconductor structure of claim 5, further comprising:
 a fifth row of source/drain diffusion strap having a first section and a second section separated from the first section by the first distance;
 a sixth row of source/drain diffusion strap having a first section and a second section separated from the first section by the first distance;
 a third row of conductive strap over the fifth row of source/drain diffusion strap and the sixth row of source/drain diffusion strap, the third row of conductive strap having a first section and a second section separated from the first section by the second distance; and
 a second conductive via electrically connecting the first column of conductive strap to the first section of the third row of conductive strap.

7. A semiconductor structure, comprising:
 a first row of source/drain diffusion strap having a first section and a second section separated from the first section;
 a second row of source/drain diffusion strap having a first section and a second section separated from the first section;
 a third row of source/drain diffusion strap having a first section and a second section separated from the first section;
 a fourth row of source/drain diffusion strap having a first section and a second section separated from the first section;
 a first row of conductive strap over the first row of source/drain diffusion strap and the second row of source/drain diffusion strap, the first row of conductive strap having a first section and a second section separated from the first section by a first space; and
 a second row of conductive strap over the third row of source/drain diffusion strap and the fourth row of source/drain diffusion strap, the second row of conductive strap having a first section and a second section separated from the first section by a second space,
 wherein the first space and the second space are misaligned.

8. The semiconductor structure of claim 7, further comprising a first column of gate strap between the first section of the first row of source/drain diffusion strap and the first section of the first row of conductive strap.

9. The semiconductor structure of claim 8, further comprising a first conductive via electrically connecting the first column of gate strap to the first section of the first row of conductive strap.

10. The semiconductor structure of claim 8, further comprising a first column of conductive strap over the first section of the first row of conductive strap.

11. The semiconductor structure of claim 10, further comprising a first conductive via electrically connecting the first column of conductive strap to the first section of the first row of conductive strap.

12. The semiconductor structure of claim 11, further comprising:
 a fifth row of source/drain diffusion strap having a first section and a second section separated from the first section;
 a sixth row of source/drain diffusion strap having a first section and a second section separated from the first section;
 a third row of conductive strap over the fifth row of source/drain diffusion strap and the sixth row of source/drain diffusion strap, the third row of conductive strap having a first section and a second section separated from the first section by a third space; and
 a second conductive via electrically connecting the first column of conductive strap to the first section of the third row of conductive strap.

13. The semiconductor structure of claim 12, wherein the first space and the third space are aligned.

14. A semiconductor structure, comprising:
 a first row of source/drain diffusion strap;
 a second row of source/drain diffusion strap adjacent to the first row of source/drain diffusion strap;
 a third row of source/drain diffusion strap adjacent to the second row of source/drain diffusion strap;
 a fourth row of source/drain diffusion strap adjacent to the third row of source/drain diffusion strap;
 a fifth row of source/drain diffusion strap adjacent to the fourth row of source/drain diffusion strap;
 a sixth row of source/drain diffusion strap adjacent to the fifth row of source/drain diffusion strap;
 a seventh row of source/drain diffusion strap adjacent to the six row of source/drain diffusion strap;
 an eighth row of source/drain diffusion strap adjacent to the seventh row of source/drain diffusion strap;
 a first column of gate strap over the first to the eighth row of source/drain diffusion strap;
 a second column of gate strap adjacent to the first column of gate strap and over the first to the eighth row of source/drain diffusion strap;
 a third column of gate strap adjacent to the second column of gate strap and over the first to the eighth row of source/drain diffusion strap;
 a fourth column of gate strap adjacent to the third column of gate strap and over the first to the eighth row of source/drain diffusion strap;
 a first conductive via on the first column of gate strap between the first row of source/drain diffusion strap and the second row of source/drain diffusion strap;
 a second conductive via on the third column of gate strap between the third row of source/drain diffusion strap and the fourth row of source/drain diffusion strap;
 a third conductive via on the fourth column of gate strap between the fifth row of source/drain diffusion strap and the sixth row of source/drain diffusion strap; and
 a fourth conductive via on the second column of gate strap between the seventh row of source/drain diffusion strap and the eighth row of source/drain diffusion strap.

15. The semiconductor structure of claim 14, further comprising:
 a first row of conductive strap on the first conductive via;
 a second row of conductive strap on the second conductive via;

a third row of conductive strap on the third conductive via; and a fourth row of conductive strap on the fourth conductive via.

16. The semiconductor structure of claim 15, wherein the first conductive via electrically connects the first column of gate strap to the first row of conductive strap, the second conductive via electrically connects the third column of gate strap to the second row of conductive strap, the third conductive via electrically connects the fourth column of gate strap to the third row of conductive strap, the fourth conductive via electrically connects the second column of gate strap to the fourth row of conductive strap.

17. The semiconductor structure of claim 16, further comprising a first column of conductive strap over the first row of conductive strap.

18. The semiconductor structure of claim 17, further comprising a first conductive via electrically connecting the first column of conductive strap to the first row of conductive strap.

19. The semiconductor structure of claim 14, further comprising:

a ninth row of source/drain diffusion strap adjacent to the eighth row of source/drain diffusion strap;

an tenth row of source/drain diffusion strap adjacent to the ninth row of source/drain diffusion strap; and a fifth conductive via on the first column of gate strap between the ninth row of source/drain diffusion strap and the tenth row of source/drain diffusion strap.

20. The semiconductor structure of claim 18, further comprising:

a fifth row of conductive strap on the fifth conductive via; and a second conductive via electrically connecting the first column of conductive strap to the fifth row of conductive strap.

* * * * *